United States Patent [19]

Phillips

[11] Patent Number: 5,424,688
[45] Date of Patent: Jun. 13, 1995

[54] FREQUENCY SYNTHESIZER APPARATUS INCORPORATING PHASE MODULATION TRACKING MEANS

[75] Inventor: Donald E. Phillips, Cedar Rapids, Iowa

[73] Assignee: Rockwell International Corp., Seal Beach, Calif.

[21] Appl. No.: 231,857

[22] Filed: Apr. 22, 1994

Related U.S. Application Data

[63] Continuation of Ser. No. 86,787, Jul. 2, 1993, abandoned.

[51] Int. Cl.[6] .............................................. H03C 3/00
[52] U.S. Cl. ........................................ 331/16; 331/17;
331/23; 332/103; 332/144; 375/308; 455/113; 455/260
[58] Field of Search .................... 331/1 A, 10, 12, 16,
331/17, 23, 25; 332/103, 104, 105, 144; 375/67, 120; 455/110, 112, 113, 260

[56] References Cited

U.S. PATENT DOCUMENTS

| | | | |
|---|---|---|---|
| 4,021,757 | 5/1977 | Nossen | 332/19 |
| 4,242,649 | 12/1980 | Washburn, Jr. | 332/18 |
| 4,313,209 | 1/1982 | Drucker | 455/112 |
| 4,492,374 | 7/1990 | Sai | 332/124 |
| 4,686,488 | 8/1987 | Attenborough | 331/2 |
| 4,739,288 | 4/1988 | Ide et al. | 332/19 |
| 4,743,867 | 5/1988 | Smith | 332/16 |
| 5,021,754 | 6/1991 | Shepard et al. | 332/128 |
| 5,180,993 | 1/1993 | Dent | 331/16 |
| 5,184,092 | 2/1993 | Shahriary et al. | 331/16 |

OTHER PUBLICATIONS

Hand Drawn Sketch of Prior Art DDS Circuit Arrangement (with comments).

*Primary Examiner*—David Mis
*Attorney, Agent, or Firm*—Kyle Eppele; M. Lee Murrah; H. Fredrick Hamann

[57] ABSTRACT

In a radio transmitter, a PM input signal is provided directly to a frequency synthesizer. The synthesizer includes a PLL having a reference frequency input signal and a controlled frequency output signal. The PLL includes a frequency divider which is directly connected in a feedback circuit path between the controlled frequency output signal and the PLL's phase-detector. The frequency divider has a frequency control input signal for setting a division ratio N for the divider, and a PM circuit has as input signal the PM input signal and the frequency control input signal. The PM circuit provides an offset signal to the phase detector output, so that the PLL creates a correcting phase signal resulting from the offset signal. The magnitude of the offset signal changes as a function of the change in the value of N.

8 Claims, 1 Drawing Sheet

FREQUENCY SYNTHESIZER APPARATUS INCORPORATING PHASE MODULATION TRACKING MEANS

This application is a Continuation of application Ser. No. 08/086,787 filed Jul. 2, 1993, now abandoned.

FIELD OF THE INVENTION

The present invention relates generally to circuits using phase modulation to transmit voice signals and data signals and, more particularly, to circuits and methods for phase modulating voice signals and data signals in a frequency synthesized radio.

BACKGROUND OF THE INVENTION

Phase-shift modulation (PSK) and quadrature phase-shift modulation (QPSK) are becoming more important in radio frequency communication systems. This is especially true in satellite communications where the available frequency spectrum is limited and costly.

Prior art phase-modulation (PM) systems have several problems that must be overcome in order to keep pace with the continued demands for effective communication in the pertinent frequency spectrums. One well known type of PM system uses balanced mixers, which require waveform shaping for spectral control. Most waveform shaping techniques result in an uneven amplitude which interferes with class-C power amplification and causes established communication links to be dropped. Consequently, the industry has looked to other PM techniques having improved performance.

One such technique implements PM using strategically placed delay lines which are used to delay the carrier signal and effect the PM based on the voice signal or data signal. Delay lines, unfortunately, require considerable space, and, as the use of integrated circuits continues to increase, the availability of such space will continue to decrease.

Two more popular PM techniques are direct digital synthesis (DDS) and digital signal processing (DSP). DDS allows the carrier signal to be directly modulated but requires relatively large and expensive frequency synthesizer designs. DSP is becoming more widely used with advances in the speed and functionality capabilities of DSP integrated circuits. However, the complexity and cost of DSP would be justified only if it is needed for other reasons.

Another PM approach uses a phase-locked loop (PLL) in the synthesizer portion of the radio transmitter. One technique is exemplified in U.S. Pat. No. 4,313,209 (E. R. Drucker). A disadvantage of his approach is that the injection of the PM input into the PLL affects the loop gain and bandwidth.

Accordingly, there is a need for a PM technique that overcomes the above-mentioned deficiencies.

SUMMARY OF THE INVENTION

The present invention provides a PM technique for use with a PLL in the synthesizer portion of the radio transmitter. This technique overcomes the previously discussed short-comings of the prior art and is further advantageous in that it can be implemented using minimal circuitry and provides a simplified frequency scheme for the entire transmitter.

In one embodiment, the present invention is realized as a radio transmitter having a signal processing controller providing a PM input signal to a frequency synthesizer, the output signal of which is amplified and coupled to a radio antenna for transmission. The synthesizer includes a PLL having a reference frequency input signal and a controlled frequency output signal. The PLL includes a phase detector, a filter, a voltage controlled oscillator (VCO) cascadely coupled so as to allow routing of signals among the components, and a frequency divider which is directly connected in a feedback circuit path between the controlled frequency output signal and the phase detector. The frequency divider has a frequency control input signal for setting a division ratio N for the divider, and a PM circuit has as input signal a PM input signal and the frequency control input signal. The PM circuit provides an offset signal to be summed with the phase detector output signal, so that the PLL creates a correcting phase signal resulting from the offset signal, and wherein the magnitude of the offset signal changes as a function of the change in the division ratio N.

The above summary is not intended to describe each aspect of the present invention, as this is the purpose of the discussion below.

DETAILED DESCRIPTION OF THE SPECIFIC EMBODIMENTS

Figure 1:
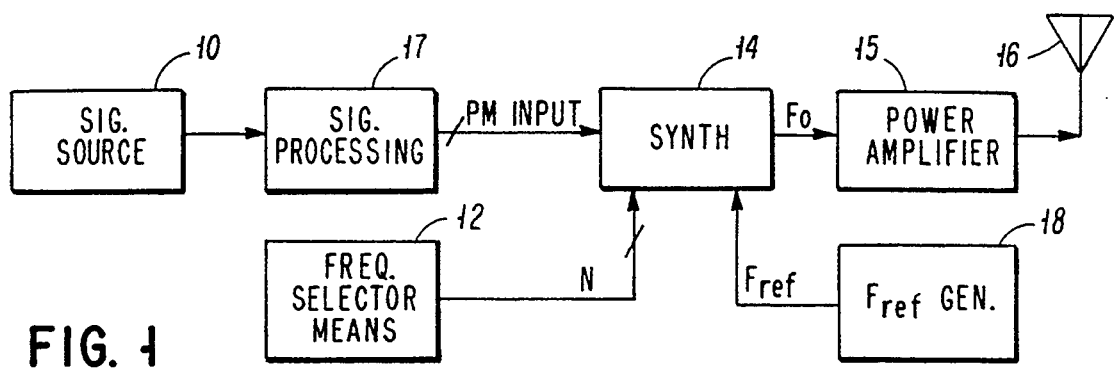
FIG. 1 is a block diagram of a radio transmitter, according to the present invention.

Turning now to the drawings and particularly to FIG. 1, a radio transmitter, in accordance with the present invention, is shown to include a signal source 10, such as a data terminal (computer) or audio amplifier, providing a pre-processed input signal for phase modulating the radio carrier frequency. The radio carrier frequency is selected by conventional frequency selector means 12. A synthesizer 14, which incorporates a novel PM circuit, provides a phase modulated output signal ($F_0$) for radio transmission through a power amplifier 15 and an antenna 16 in response to the phase modulated input signal, a frequency select signal (N), and a controlled reference frequency ($F_{ref}$) coupled as shown to one another to allow signal transmission. $F_{ref}$ is provided by a conventional reference frequency generator 18, preferably a high-stability oscillator.

The phase modulated input signal can be provided in either analog or digital form. If desired, the phase modulated input signal is processed by conventional signal processing means 17 for filtering and level-adjusting the PM input signal prior to the synthesizer 14.

For further information regarding acceptable implementation of the frequency selector means 12, the signal processing means 17, the reference frequency generator 18 and related components, reference may be made to U.S. Pat. Nos. 4,686,488 (A. Attenborough), 4,242,649 (C. Washburn, Jr.), 4,739,288 (J. Ide et al.), 4,743,867 (J. M. Smith), 4,942,374 (K. Sai), 4,021,757 (E. J. Nossen) and 5,021,754 (W. P. Shepherd et al.), all herein incorporated by reference.

Figure 2:
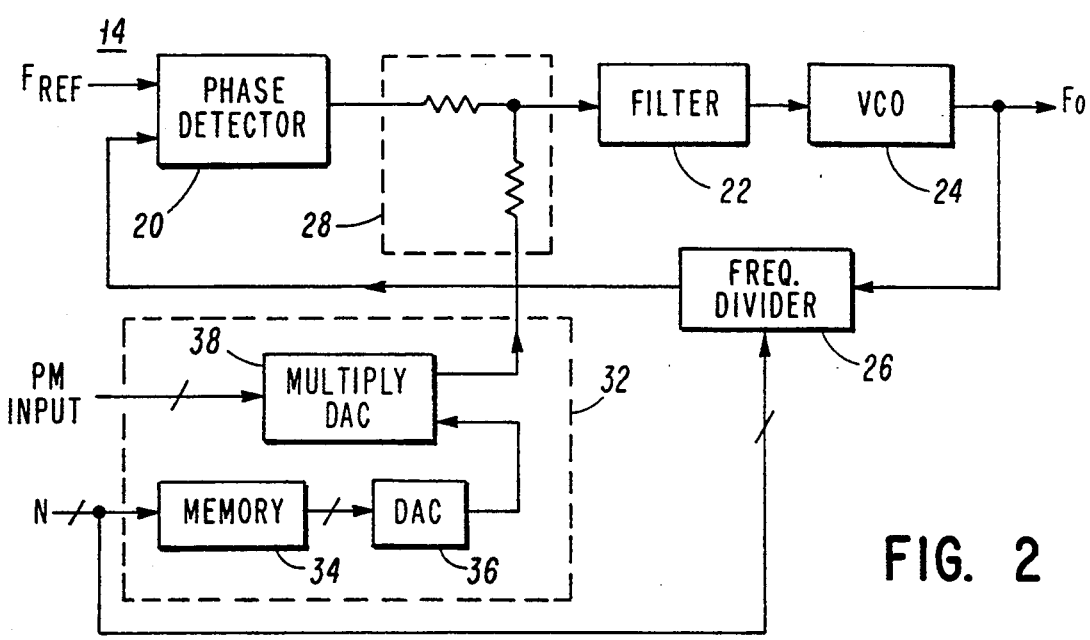
FIG. 2 is a block diagram of a phase modulator/synthesizer for the radio transmitter of FIG. 1.

Referring now to FIG. 2, the synthesizer 14 of FIG. 1 is shown in greater detail. The synthesizer 14 includes a phase detector 20, a summing means 28, a low-pass-filter 22, a VCO 24 and a frequency divider 26 mechanically cascadely coupled in such a manner so as to form a feedback circuit path between the output signal of VCO 24 and the input signal of phase detector 20. These elements, except for the summing means 28, are also described in the referenced U.S. patents.

The phase detector 20 compares its two input signals, $F_{ref}$ and the output signal of the frequency divider 26, to accomplish phase synchronization. This is done by determining any difference in phase between the two signals. If a phase difference is detected, the phase detector generates a corresponding error voltage signal, which is applied to the VCO 24 via the summary means 28 and the filter 22 adjusting its frequency until the phase difference disappears. The bandwidth of the PLL is controlled by the bandwidth of the low-pass-filter 22, the bandwidth being set sufficiently small to remove noise and sufficiently large to allow the loop to pull into the locked mode quickly during frequency switching. By selectively controlling the frequency select signal input (N), the VCO frequency output signal $F_0$ is a selected multiple of $F_{ref}$.

The effect of summing means 28, is an important part of the present invention, because it is used to permit the PLL (which is typically required circuitry in synthesized radios) to be used as part of the PM circuitry. Combining the PM and frequency synthesis functions in this manner permits implementation of the radio transmitter, using conventional digital circuitry, in integrated circuit technology. Combining these functions is accomplished, in accordance with the present invention, by processing the PM input signal and providing this processed signal as an offset signal to the output signal of the phase detector 20, so that the PLL creates a correcting phase signal resulting from the offset signal. The PM input signal is processed so that the magnitude of the offset signal changes as a function of the change in the division ratio N. In the implementation shown in FIG. 2, this offset signal is added to the output signal of the phase detector 20 using conventional summing means 28, implemented, for example using a passive resistor network as shown or alternatively an active operational amplifier network.

Understanding the need for properly processing the PM input is best addressed by first examining the ramifications of applying the PM input signal directly to summing means 28. In a conventional PLL, the frequency output signal of the VCO 24 is designed to be in locked mode only when the phase difference between the signals $F_{ref}$ and $F_0$ is zero or almost zero. When a signal, such as the PM input signal, is coupled directly to the output signal of the phase detector 20, the current (or voltage) added to or subtracted from the error signal causes the value of $F_0$ to change. This forces a phase adjustment between the previously synchronized signals, $F_{ref}$ and $F_0$, and therefore an error correction occurs at the output of the phase detector 20. Because the value of the signal $F_0$ is equal to the value of N times the signal $F_{ref}$, the added or subtracted current (or voltage) to the output signal of the phase detector 20 corresponds to a phase change to the output of the VCO which is N times the change at the phase detector.

Accordingly, since the value of N varies with the programmed frequency provided by the frequency selector means (12 of FIG. 1), the voltage (or current) modulation coupled to the output signal of the phase detector 20, via the summing means 28, is corrected for the effect of the multiplication by the value of N. One implementation for such correction is a phase modulation/compensation circuit 32, depicted in dashed lines of FIG. 2.

The phase modulation/compensation circuit 32 effectively multiplies the PM input signal by a factor inversely corresponding to the magnitude of N, converts the product to an analog offset signal, and then adds the offset signal to the output signal of the phase detector 20 via the summing means 28. Accordingly, a non-volatile memory unit 34 (for example, a ROM) is programmed with a look-up table such that one of a series of data words, increasing in value with 1/N and representing the best compensation values for the effect of the changing N value, is provided in response to the memory unit 34 address being selected by the multiple-bit N.

The multiple-bit data word which is output signal from the memory unit 34 is provided as an converted to analog form via a conventional digital-to-analog converter (DAC) 36 and is used to control a multiplying DAC 38. The DAC 38 converts the PM input signal to provide the compensating offset signal for correcting for the effect of the multiplication of the phase detector changed by the value N. The DACs 36 and 38 may be any commercially available device such as part no. DAC-08 from Analog Devices, Inc. of Norwood, Mass. For digital modulation, an oversampled input signal with the PLL filtering effect shapes the rise and fall times to provide an acceptable trade-off between signal transmission and adjacent channel interference.

There are numerous alternative ways to implement the compensation function provided by the phase modulation/compensation circuit 32 of FIG. 2. For example, the discrete circuit blocks of the phase modulation/compensation circuit 32 could be replaced by programming a logic device, such as a digital signal processor, including sufficient (internal or external) memory for the look-up table and corresponding DAC devices.

Figure 3:
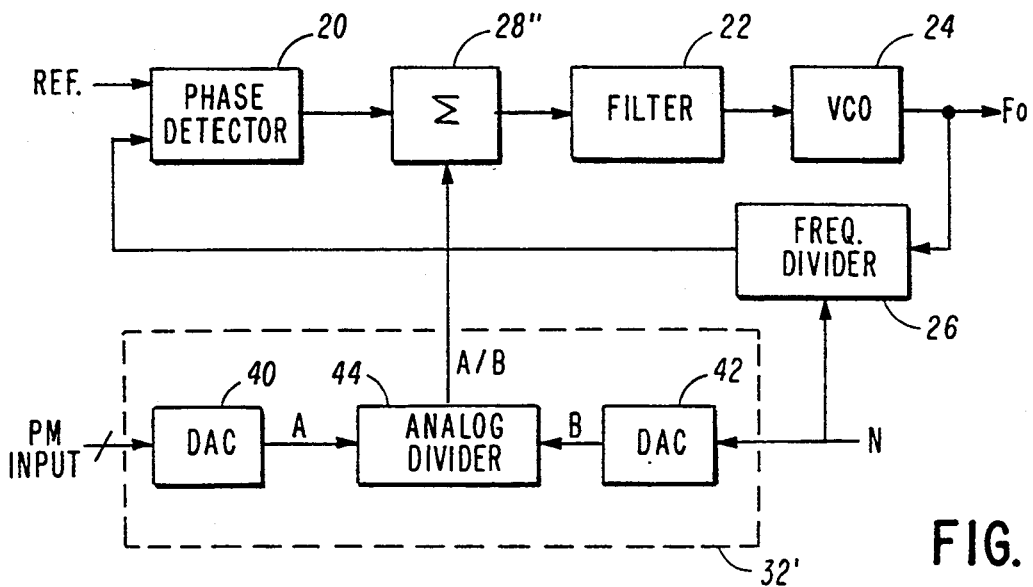
FIG. 3 is a block diagram of yet another phase modulator/synthesizer for the radio transmitter of FIG. 1.

An alternate way for implementing the function of the phase modulation/compensation circuit is shown in FIG. 3 as 32'. In this implementation, the PM input signal and the digital signal corresponding to the magnitude of 1/N are converted to analog form using DACs 40 and 42, respectively. The analog form output signal A of DAC 40, of the PM input signal is divided by the analog form, output signal B of DAC 42. The division is implemented using a conventional analog divider circuit 44, such as part no. 145152 type device available from Motorola, Inc., Schaumburg, Ill. The output signal of the analog divider circuit 44 is routed to summing means 28" which then adds the quotient to the output signal of the phase detector 20 to compensate for the effect of the multiplication of the phase detector change by the value of N.

Accordingly, the present invention provides a radio transmitter having a combined yet accurate phase-modulation/frequency synthesizer circuit, making the invention ideal for implementation in an integrated circuit.

Those skilled in the art will readily recognize that various modifications and changes may be made to the present invention without departing from the true spirit and scope thereof, which is set forth in the following claims.

I claim:

1. A frequency synthesizer for use in RF communication apparatus having a phase-locked loop, comprising:
   a phase detector having an output signal;

summing means directly coupled to the phase detector output signal, said summing means having a second output signal;

a filter directly coupled to said summing means output signal, yielding a filtered output signal;

a voltage controlled oscillator directly coupled to the filtered output signal, said voltage controlled oscillator generating a controlled frequency output signal;

a frequency divider disposed between the voltage controlled oscillator output signal and an input port of the phase detector and directly coupled to each, said frequency divider generating an output signal that is a mathematical multiple of the voltage controlled oscillator output signal; and means for generating an external phase modulation correction signal directly coupled to an input port of said summing means, the phase modulation correction signal of such value that phase shift introduced into the frequency divider output signal is eliminated.

2. A frequency synthesizer, according to claim 1, wherein the magnitude of the phase modulation correction signal changes inversely proportional to the frequency divider output signal.

3. A frequency synthesizer, according to claim 2, wherein the means for generating a phase modulation correction signal is comprised of a multiplying digital-to-analog signal converter responsive to a phase modulated input signal and the frequency control input signal.

4. A frequency synthesizer, according to claim 3, further including a memory unit storing a look-up table and providing a table output signal, and a digital-to-analog converter converting the table output signal to an analog signal for processing by the multiplying digital-to-analog signal converter.

5. A frequency synthesizer, according to claim 1, wherein the means for generating a phase modulation correction signal is comprised of a multiplying digital-to-analog signal converter responsive to a phase modulated input signal and the frequency control input signal.

6. A frequency synthesizer, according to claim 5, further including a memory unit storing a look-up table and providing a table output signal, and a digital-to-analog converting the table output signal to an analog signal for processing by the multiplying digital-to-analog signal converter.

7. A method of using phase modulation in a radio having a frequency synthesizer, comprising the following steps:

comparing an input signal value to a desired reference signal value;

detecting a quantitative difference in the input signal value and the reference signal value;

generating an error correction signal relative in magnitude to the detected difference in the input signal value and the reference signal value;

applying a frequency divider factor representative of user selection;

routing said frequency divider factor to phase modulation correction means;

generating an external phase modulation correction signal based upon the frequency divider factor; and summing the external phase modulation correction signal and the error correction signal prior to routing the error correction signal to an oscillator means.

8. The method of claim 7, wherein the step of generating an external phase modulation correction signal includes using the inverse proportion of the frequency divide factor for the value of the phase modulation correction signal.

* * * * *